(12) United States Patent
Gao et al.

(10) Patent No.: US 11,289,559 B2
(45) Date of Patent: Mar. 29, 2022

(54) OLED DISPLAY PANEL, COMPRISING SUB-PIXEL PROVIDED WITH FIRST HOLE

(71) Applicant: WUHAN CHINA STAR OPTOELECTRONICS SEMICONDUCTOR DISPLAY TECHNOLOGY CO., LTD., Wuhan (CN)

(72) Inventors: Hong Gao, Wuhan (CN); Min Zheng, Wuhan (CN); Mugyeom Kim, Wuhan (CN); Yong Zhao, Wuhan (CN)

( * ) Notice: Subject to any disclaimer, the term of this patent is extended or adjusted under 35 U.S.C. 154(b) by 324 days.

(21) Appl. No.: 16/475,381

(22) PCT Filed: Mar. 7, 2019

(86) PCT No.: PCT/CN2019/077274
§ 371 (c)(1),
(2) Date: Jul. 2, 2019

(87) PCT Pub. No.: WO2020/133701
PCT Pub. Date: Jul. 2, 2020

(65) Prior Publication Data
US 2021/0280650 A1    Sep. 9, 2021

(30) Foreign Application Priority Data
Dec. 29, 2018  (CN) .......................... 201811644090.2

(51) Int. Cl.
*H01L 29/08*   (2006.01)
*H01L 27/32*   (2006.01)
*H01L 51/00*   (2006.01)
*H01L 51/50*   (2006.01)
*H01L 51/56*   (2006.01)

(52) U.S. Cl.
CPC ...... *H01L 27/3258* (2013.01); *H01L 27/3218* (2013.01); *H01L 27/3246* (2013.01); *H01L 51/0096* (2013.01); *H01L 51/5012* (2013.01); *H01L 51/56* (2013.01); *H01L 2227/323* (2013.01)

(58) Field of Classification Search
CPC ............. H01L 27/3258; H01L 27/3218; H01L 27/3246; H01L 51/0096; H01L 51/5012; H01L 51/56
See application file for complete search history.

(56) References Cited

U.S. PATENT DOCUMENTS

| 2016/0190503 | A1* | 6/2016 | Chang ................. H01L 51/0096 257/40 |
| 2017/0154919 | A1* | 6/2017 | Chen .................... H01L 21/6835 |
| 2019/0027702 | A1* | 1/2019 | You ......................... H01L 51/56 |
| 2019/0093216 | A1* | 3/2019 | Zhou ....................... H01L 51/56 |

* cited by examiner

Primary Examiner — Phuc T Dang

(57) ABSTRACT

An organic light emitting diode (OLED) display panel, a manufacturing method thereof, and an intelligent terminal are provided. The OLED display panel includes an electronic component area configured to position an electronic component and a sub-pixel area correspondingly disposed above the electronic component. The sub-pixel area includes a plurality of sub-pixels, and a first hole disposed on one of the sub-pixels is filled with a transparent material, which increases a screen-to-body ratio of the OLED display screen.

16 Claims, 3 Drawing Sheets

OLED DISPLAY PANEL, COMPRISING SUB-PIXEL PROVIDED WITH FIRST HOLE

FIELD OF INVENTION

The present disclosure relates to the field of display technologies, and more particularly to an organic light emitting diode (OLED) display panel, a manufacturing method thereof, and an intelligent terminal.

BACKGROUND OF INVENTION

With development of full display technology, an organic light-emitting diode (OLED) display screen is required for a higher screen-to-body ratio. In existing technologies, a camera module of an OLED display is disposed in a camera area, thereby an O-cut area and a U-cut area need be designed in the camera area. However, the O-cut area and the U-cut area occupy a large space in the camera area, which leads to a wider non-display area of the OLED display screen and a smaller screen-to-body ratio of the OLED display screen.

SUMMARY OF INVENTION

An object of the present disclosure is to provide an organic light emitting diode (OLED) display panel, a manufacturing method thereof, and an intelligent terminal to solve the problem of a smaller screen-to-body ratio of existing OLED display screen.

To achieve the above object, an embodiment of the present disclosure provides an OLED display panel. The OLED display panel includes an electronic component area configured to position an electronic component and a sub-pixel area correspondingly disposed above the electronic component area. The sub-pixel area includes a plurality of sub-pixels, and a first hole disposed on one of the sub-pixels is filled with a transparent material.

In an embodiment of the present disclosure, the OLED display panel further includes a thin film transistor layer disposed between the electronic component area and the sub-pixel area. A second hole disposed on the thin film transistor layer and corresponding to the electronic component area is filled with the transparent material.

In an embodiment of the present disclosure, the OLED display panel further includes a substrate that includes the electronic component area. The electronic component area is a groove disposed on a side of the substrate away from the sub-pixel area.

In an embodiment of the present disclosure, an orthographic projection of the first hole on the substrate is within the groove.

In an embodiment of the present disclosure, the thin film transistor layer includes a buffer layer, an active layer, an insulating interlayer, a gate, a gate insulating layer, a source, a drain, and a planarization layer sequentially stacked on the substrate. The second hole extends through the buffer layer, the active layer, the insulating interlayer, the gate, the gate insulating layer, the source, the drain, and the planarization layer, or the second hole extends through the active layer, the insulating interlayer, the gate, the gate insulating layer, the source, the drain, and the planarization layer.

In an embodiment of the present disclosure, the transparent material is selected from siloxane and colorless polyimide.

In an embodiment of the present disclosure, the OLED display panel further includes a display area disposed outside the electronic component area. Pixel density in the sub-pixel area correspondingly disposed above the electronic component area is less than pixel density in the display area.

An embodiment of the present disclosure further provides a method of manufacturing an OLED display panel. The method includes: disposing an electronic component area and a sub-pixel area correspondingly, wherein the electronic component area is configured to position an electronic component, and the sub-pixel area includes a plurality of sub-pixels; and disposing a first hole on one of the sub-pixels and filling a transparent material in the first hole.

In an embodiment of the present disclosure, the method further includes: disposing a thin film transistor layer between the electronic component area and the sub-pixel area; and disposing a second hole on the thin film transistor layer and filling the transparent material in the second hole, wherein the second hole corresponds to the electronic component area.

In an embodiment of the present disclosure, the method further includes: providing a substrate; and disposing a groove on a side of the substrate away from the sub-pixel area, wherein the electronic component area is the groove, and an orthographic projection of the first hole on the substrate is within the groove.

An embodiment of the present disclosure further provides an intelligent terminal. The intelligent terminal includes an OLED display panel and an electronic component. The OLED display panel includes an electronic component area and a sub-pixel area correspondingly disposed above the electronic component area. The sub-pixel area includes a plurality of sub-pixels. A first hole disposed on one of sub-pixels is filled with a transparent material, and the electronic component is disposed in the electronic component area.

In an embodiment of the present disclosure, the OLED display panel further includes a thin film transistor layer disposed between the electronic component area and the sub-pixel area. A second hole disposed on the thin film transistor layer and corresponding to the electronic component area is filled with the transparent material.

In an embodiment of the present disclosure, the OLED display panel further includes a substrate that includes the electronic component area. The electronic component area is a groove disposed on a side of the substrate away from the sub-pixel area.

In an embodiment of the present disclosure, an orthographic projection of the first hole on the substrate is within the groove.

In an embodiment of the present disclosure, the thin film transistor layer includes a buffer layer, an active layer, an insulating interlayer, a gate, a gate insulating layer, a source, a drain, and a planarization layer sequentially stacked on the substrate. The second hole extends through the buffer layer, the active layer, the insulating interlayer, the gate, the gate insulating layer, the source, the drain, and the planarization layer, or the second hole extends through the active layer, the insulating interlayer, the gate, the gate insulating layer, the source, the drain, and the planarization layer.

In an embodiment of the present disclosure, the transparent material is selected from siloxane and colorless polyimide.

In an embodiment of the present disclosure, the OLED display panel further includes a display area disposed outside the electronic component area. pixel density in the sub-pixel area correspondingly disposed above the electronic component area is less than pixel density in the display area.

The benefits of the present disclosure are: the first hole disposed on one of the sub-pixels in the sub-pixel area corresponding to the electronic component area is filled with the transparent material, which decreases the pixel density in the sub-pixel area corresponding to the electronic component area and improves light transmittance in the electronic component area, meanwhile decreases a space of the electronic component area occupied in the non-display area and increases a screen-to-body ratio of the OLED display screen.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
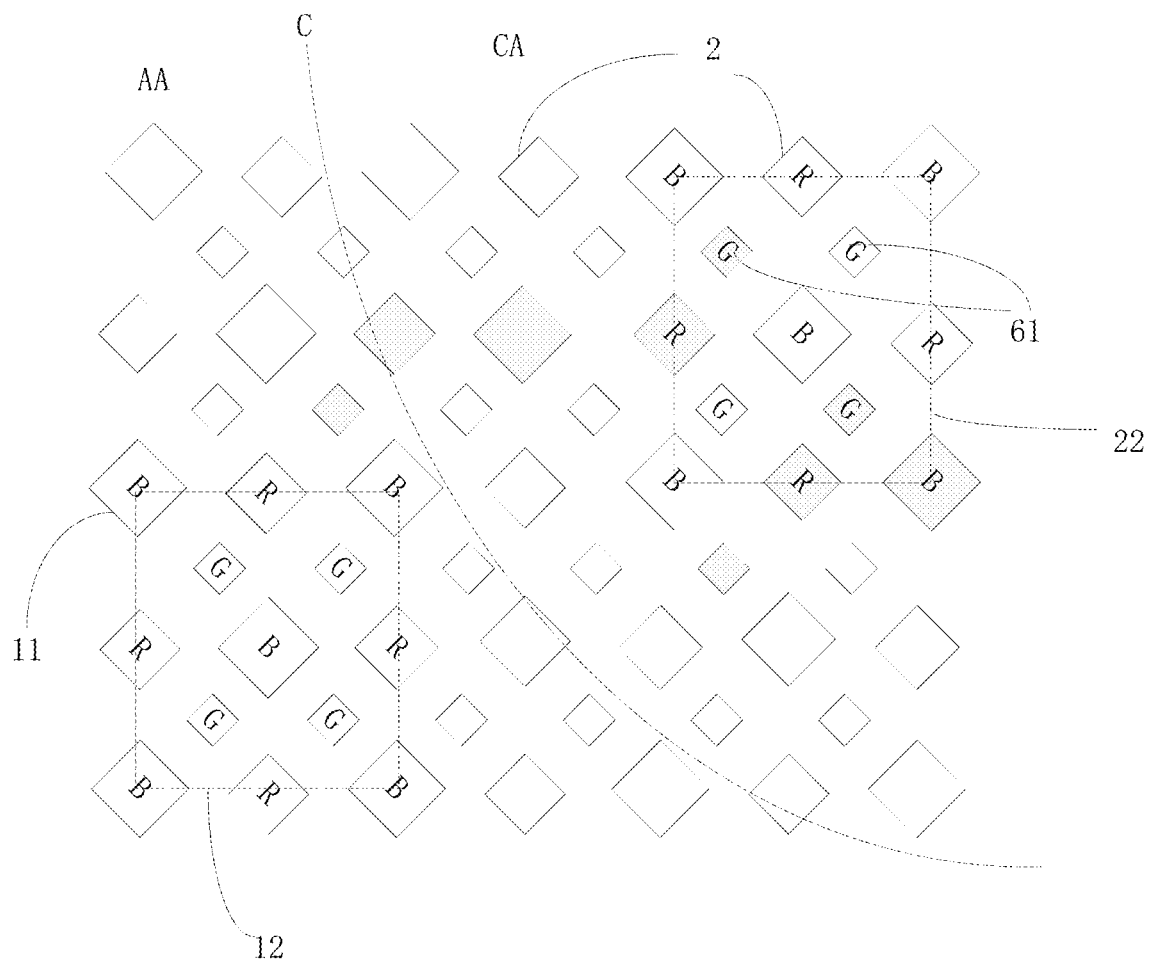
FIG. 1 is a distribution diagram of a display area and a sub-pixel area according to an embodiment of the present disclosure.

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary and are intended to illustrate and interpret the present disclosure, which shall not be construed as causing limitations to the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

Referring to FIG. 1, an organic light emitting diode (OLED) display panel includes a display area AA, a sub-pixel area CA, and an electronic component area (not shown in the FIG. 1). The display area AA is disposed outside the electronic component area, and the sub-pixel area CA corresponds to the electronic component area. A left side of a boundary C in the FIG. 1 is the display area AA, and a right side of the boundary C in the FIG. 1 is the sub-pixel area CA.

The sub-pixel area CA includes a plurality of sub-pixels 2. A first hole 61 is disposed on one of the sub-pixels 2, which improves light transmittance in the electronic component area, so that an electronic component (such as a camera) can be positioned in the electronic component area.

Further, the first hole 61 is filled with a transparent material. The transparent material is selected from siloxane and colorless polyimide (CPI). The first hole 61 is filled with the transparent material, which improves photosensitive properties in the electronic component area and improves shooting effect of the camera if the electronic component is the camera.

Referring to FIG. 1, the sub-pixel area CA includes a plurality of sub-pixels 2, and the display area AA includes a plurality of sub-pixels 11. Each of the sub-pixels is selected from blue sub-pixels B, red sub-pixels R, and green sub-pixels R. Pixel density of the sub-pixels 2 in the sub-pixel area CA is equal to pixel density of the sub-pixels 11 in the display area AA before the first hole 61 is disposed in the sub-pixel area CA. The pixel density (PPI) means a quantity of sub-pixels in per unit area. The first hole 61 is disposed on one of the sub-pixels 2 in the sub-pixel area CA, which reduces the quantity of the sub-pixels 2 in the sub-pixel area CA, so that the pixel density of the sub-pixels 2 in the sub-pixel area CA is less than the pixel density of the sub-pixels 11 in the display area AA, which improves light transmittance in the electronic component area.

For example, two red sub-pixels R, four green sub-pixels G, and two blue sub-pixels B are disposed in a dotted area 12 in the display area AA. Also, two red sub-pixels R, four green sub-pixels G, and two blue sub-pixels B are disposed in an area 22 with the same size of the dotted area 12 in the sub-pixel area CA before the first hole 61 is disposed. Then the first hole 61 is disposed on each of two green sub-pixels G in the area 22, that is, the two green sub-pixels G in the area 22 are removed, thereby the sub-pixels in the area 22 are two red sub-pixels R, two green sub-pixels G and two blue sub-pixels B, so that the pixel density of the sub-pixels 2 in the sub-pixel area CA is less than the pixel density of the sub-pixels 11 in the display area AA, and then light transmittance in the sub-pixel area CA is higher than light transmittance in the display area AA, which improves the light transmittance in the electronic component area corresponding to the sub-pixel area CA.

In a specific embodiment of the present disclosure, the electronic component area is disposed on the bottom of the OLED display and corresponds to the sub-pixel area CA, so that the electronic component is disposed on the bottom of the OLED display and corresponds to the sub-pixel area CA, which decreases a space of the electronic component occupied in a non-display area and increases a screen-to-body ratio of the OLED display screen.

Figure 2:
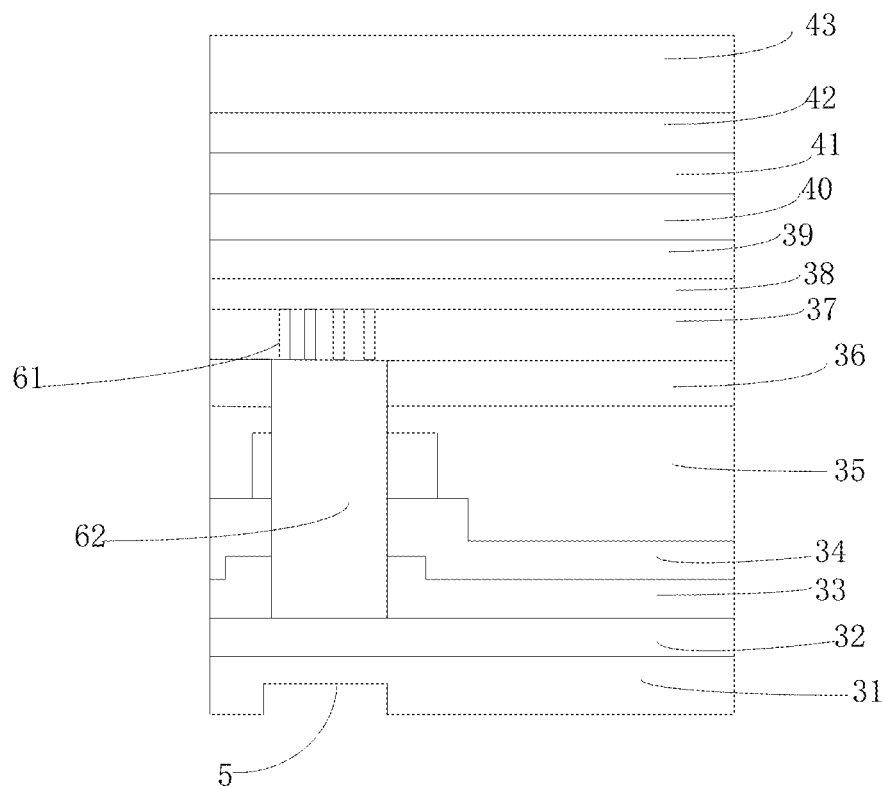
FIG. 2 is a schematic structural diagram of an organic light emitting diode (OLED) display panel according to an embodiment of the present disclosure.

In a specific embodiment of the present disclosure, referring to FIG. 2, the OLED display panel further includes a substrate 31. Material of the substrate 31 is mainly polyimide (PI), and the polyimide can improve light transmittance of the substrate 31. A groove 5 is disposed on a side of the substrate 31 away from the sub-pixel area CA, and the groove 5 is the electronic component area. An orthographic projection of the first hole 61 on the substrate 31 is within the groove 5. The groove 5 is disposed on the substrate 31, which makes the substrate 31 to be thinner and then improves the light transmittance in the electronic component area disposed on the bottom of the substrate 31.

Further, the OLED display panel includes a thin film transistor layer disposed between the electronic component area and the sub-pixel area. A second hole disposed on the thin film transistor layer and corresponding to the electronic component area is filled with the transparent material.

It is understood that, the thin film transistor layer is disposed on a side of the substrate 31 toward to the sub-pixel area. The transparent material filled in the second hole is selected from siloxane and colorless polyimide. A position of the second hole corresponds to a position of the electronic component area, and a size of the second hole corresponds to a size of the electronic component area. The transparent material filled in the second hole further improves the light transmittance in the electronic component area.

Specifically, referring to FIG. 2, the thin film transistor layer includes a buffer layer 32, an active layer (not shown in the FIG. 2), an inorganic insulating layer 33, a gate (not shown in the FIG. 2), an organic insulating layer 34, a source (not shown in the FIG. 2), a drain (not shown in the FIG. 2), and a planarization layer 35. The buffer layer 32 is disposed on the substrate 31, and material of the buffer layer 32 is selected from SiN, SiO, and SiON. The active layer is disposed on the buffer layer 32. The inorganic insulating layer 33 is disposed on the active layer and the buffer layer 32. The gate is disposed on the inorganic insulating layer 33. The organic insulating layer 34 is disposed on the gate and the inorganic insulating layer 33. The source and the drain are disposed on the organic insulating layer 34. The planarization layer 35 is disposed on the source, the drain, and the organic insulating layer 34, and material of the planarization layer 35 is mainly PI.

Referring to FIG. 2, the second hole 62 extends through the active layer, the inorganic insulating layer 33, the gate, the organic insulating layer 34, the source, the drain, and the planarization layer 35. In addition, the second hole 62 extends through the buffer layer 32 based on requirements of engineering, that is, the second hole 62 extends through the buffer layer 32, the active layer, the inorganic insulating layer 33, the gate, the organic insulating layer 34, the source, the drain, and the planarization layer 35.

Further, the OLED display panel includes an anode (not shown in the FIG. 2), a pixel defining layer 36, an electroluminescence layer 37, and a cathode (not shown in the FIG. 2). The anode is disposed on the planarization layer 35. The pixel defining layer 36 is disposed on the anode and the planarization layer 35, and material of the pixel defining layer 36 mainly is PI. The electroluminescence layer 37 is disposed on the anode and the pixel defining layer 36. The cathode is disposed on the electroluminescence layer 37 and the pixel defining layer 36.

Further, the second hole 62 extends through the pixel defining layer 36. The first hole 61 is disposed on the electroluminescence layer 37, referring to FIG. 2, a plurality of first holes 61 are disposed on the electroluminescence layer 37, and an orthographic projection of the first holes 61 on the substrate is within the groove 5. The first hole 61 extends through the electroluminescence layer 37, or the first hole 61 partly extends through the electroluminescence layer 37. In addition, the anode or the cathode is available with a hole or without a hole. When the hole is disposed on the anode or the cathode, a position of the hole corresponds to the position of the second hole 62.

Further, a first chemical vapor deposition layer 38, a hyaline layer 39, a second chemical vapor deposition layer 40, a touch layer 41, a polaroid 42, and a cover glass 43 are sequentially stacked on a side of the sub-pixel area CA away from the electronic component area 5.

It is understood that, the transparent material filled in the first hole 61 and the second hole 62 can be the material of the hyaline layer 39.

It is known from the above, for the OLED display panel according to an embodiment of the present disclosure, the first hole disposed on one of the sub-pixels in the sub-pixel area correspondingly disposed above the electronic component area is filled with the transparent material, which decreases the pixel density in the sub-pixel area correspondingly disposed above the electronic component area and improves a light transmittance in the electronic component area, meanwhile decreases the space of the electronic component area occupied in the non-display area and increases the screen-to-body ratio of the OLED display screen.

Figure 3:
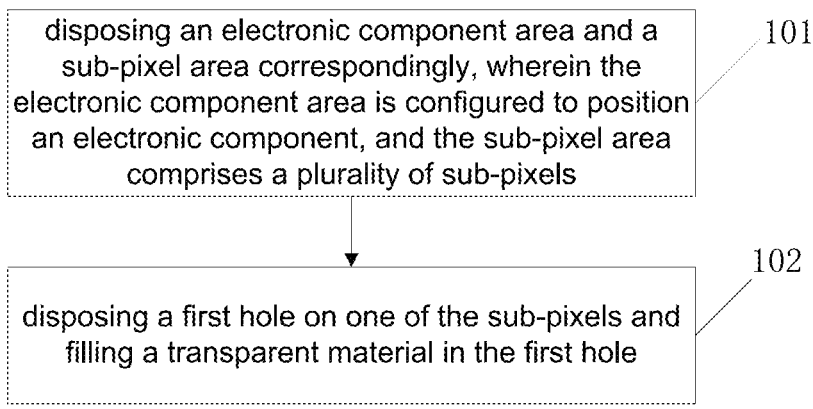
FIG. 3 is a flow chart illustrating a method of manufacturing an OLED display panel according to an embodiment of the present disclosure.

As shown in FIG. 3, the FIG. 3 is a flow chart illustrating a method of manufacturing an OLED display panel according to a first embodiment. The method includes the following steps:

Step 101, disposing an electronic component area and a sub-pixel area correspondingly, wherein the electronic component area is configured to position an electronic component, and the sub-pixel area includes a plurality of sub-pixels.

In an embodiment of the present disclosure, referring to the FIG. 1, an OLED display panel includes a display area AA, a sub-pixel area CA, and an electronic component area (not shown in the FIG. 1). The display area AA is disposed outside the electronic component area, and the sub-pixel area CA corresponds to the electronic component area. A left side of a boundary C in the FIG. 1 is the display area AA, and a right side of the boundary C in the FIG. 1 is the sub-pixel area CA. The sub-pixel area CA includes a plurality of sub-pixels 2.

Step 102, disposing a first hole on one of the sub-pixels and filling a transparent material in the first hole.

In an embodiment of the present disclosure, a first hole 61 is disposed on one of the sub-pixels 2, which improves light transmittance in the electronic component area, so that an electronic component can be positioned in the electronic component area. The first hole 61 is filled with a transparent material. The transparent material is selected from siloxane and colorless polyimide. The first hole 61 is filled with the transparent material, which improves photosensitive properties in the electronic component area, and improves shooting effect of a camera if the electronic component is the camera.

Referring to FIG. 1, the sub-pixel area CA includes a plurality of sub-pixels 2, and the display area AA includes a plurality of sub-pixels 11. Each of the sub-pixels is selected from blue sub-pixels B, red sub-pixels R and green sub-pixels R. Pixel density of the sub-pixels 2 in the sub-pixel area CA is equal to pixel density of the sub-pixels 11 in the display area AA before the first hole 61 is disposed in the sub-pixel area CA. The pixel density (PPI) means a quantity of sub-pixels in per unit area. The first hole 61 is disposed on one of the sub-pixels 2 in the sub-pixel area CA, which reduces a number of the sub-pixels 2 in the sub-pixel area CA, so that the pixel density of the sub-pixels 2 in the sub-pixel area CA is less than the pixel density of the sub-pixels 11 in the display area AA, which improves light transmittance in the electronic component area.

Further, the method includes: disposing a thin film transistor layer between the electronic component area and the sub-pixel area; and disposing a second hole on the thin film transistor layer and filling the transparent material in the second hole, wherein the second hole corresponds to the electronic component area.

It is understood that, the transparent material filled in the second hole is selected from siloxane and colorless polyimide. A position of the second hole corresponds to a position of the electronic component area, and a size of the second hole corresponds to a size of the electronic component area. The transparent material filled in the second hole further improves the light transmittance in the electronic component area.

Further, the method includes: providing a substrate; and disposing a groove on a side of the substrate away from the sub-pixel area, wherein the electronic component area is the groove, and an orthographic projection of the first hole on the substrate is within the groove.

In a specific embodiment of the present disclosure, the electronic component area is disposed on the bottom of the OLED display and corresponds to the sub-pixel area CA, so that the electronic component is disposed on the bottom of the OLED display and corresponds to the sub-pixel area CA, which decreases a space of the electronic component occupied in the non-display area and increases a screen-to-body ratio of the OLED display screen.

In a specific embodiment of the present disclosure, referring to FIG. 2, the OLED display panel further includes a substrate 31. Material of the substrate 31 is mainly polyimide (PI), and the polyimide can improve a light transmittance of the substrate 31. A groove 5 is disposed on a side of the substrate 31 away from the sub-pixel area CA, and the groove 5 is the electronic component area. An orthographic projection of the first hole 61 on the substrate 31 is within the groove 5. The groove 5 is disposed on the substrate 31, which makes the substrate 31 to be thinner, further improves the light transmittance in the electronic component area disposed on the bottom of the substrate 31.

It is known from the above, for the method of manufacturing an OLED display panel according to an embodiment of the present disclosure, the first hole disposed on one of the sub-pixels in the sub-pixel area corresponding to the electronic component area is filled with the transparent material, which decreases the pixel density in the sub-pixel area corresponding to the electronic component area and improves light transmittance in the electronic component area, meanwhile decreases the space of the electronic component area occupied in the non-display area and increases the screen-to-body ratio of the OLED display screen.

Figure 4:
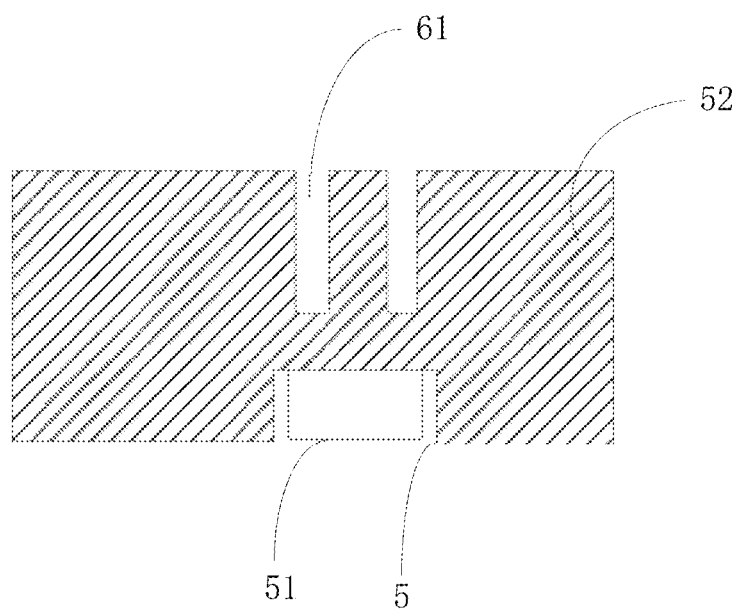
FIG. 4 is a schematic structural diagram of an intelligent terminal according to an embodiment of the present disclosure.

As shown in FIG. 4, the FIG. 4 is a schematic structural diagram of an intelligent terminal according to an embodiment of the present disclosure. The intelligent terminal includes an electronic component 51 and an OLED display panel 52. The OLED display panel 52 is the OLED display panel in above embodiment, so that the OLED display panel 52 will not be described anymore.

The electronic component 51 is disposed on an electronic component area 5 at the back of the OLED display panel 52. The electronic component area 5 can be a groove 5 at the back of the OLED display panel 52, that is, the electronic component 51 can be disposed in the groove 5 at the back of the OLED display panel 52.

It is known from the above, for the intelligent terminal according to an embodiment of the present disclosure, the first hole disposed on one of the sub-pixels in the sub-pixel area corresponding to the electronic component area is filled with the transparent material, which decreases the pixel density in the sub-pixel area corresponding to the electronic component area and improves light transmittance in the electronic component area, meanwhile decreases a space of the electronic component area occupied in the non-display area and increases a screen-to-body ratio of the OLED display screen.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. An organic light emitting diode (OLED) display panel, comprising:

an electronic component area configured to position an electronic component; and a sub-pixel area correspondingly disposed above the electronic component area;

wherein the sub-pixel area comprises a plurality of sub-pixels, and a first hole disposed on one of the sub-pixels is filled with a transparent material.

2. The OLED display panel according to claim 1, further comprising a thin film transistor layer disposed between the electronic component area and the sub-pixel area, wherein a second hole disposed on the thin film transistor layer and corresponding to the electronic component area is filled with the transparent material.

3. The OLED display panel according to claim 2, further comprising a substrate that comprises the electronic component area, wherein the electronic component area is a groove disposed on a side of the substrate away from the sub-pixel area.

4. The OLED display panel according to claim 3, wherein an orthographic projection of the first hole on the substrate is within the groove.

5. The OLED display panel according to claim 3, wherein the thin film transistor layer comprises a buffer layer, an active layer, an insulating interlayer, a gate, a gate insulating layer, a source, a drain, and a planarization layer sequentially stacked on the substrate, and wherein the second hole extends through the buffer layer, the active layer, the insulating interlayer, the gate, the gate insulating layer, the source, the drain, and the planarization layer, or the second hole extends through the active layer, the insulating interlayer, the gate, the gate insulating layer, the source, the drain, and the planarization layer.

6. The OLED display panel according to claim 1, wherein the transparent material is selected from siloxane and colorless polyimide.

7. The OLED display panel according to claim 1, further comprising a display area disposed outside the electronic component area, wherein pixel density in the sub-pixel area correspondingly disposed above the electronic component area is less than pixel density in the display area.

8. A method of manufacturing an organic light emitting diode (OLED) display panel, comprising:

providing a substrate;

forming a groove on a side of the substrate as an electronic component area configured to position an electronic component;

disposing a sub-pixel area on a side of the substrate away from the electronic component area, wherein the sub-pixel area corresponds to the electronic component area and comprises a plurality of sub-pixels;

disposing a first hole on one of the sub-pixels, wherein an orthographic projection of the first hole on the substrate is within the electronic component area; and filling a transparent material in the first hole.

9. The method of manufacturing the OLED display panel according to claim 8, further comprising:

disposing a thin film transistor layer between the electronic component area and the sub-pixel area; and disposing a second hole on the thin film transistor layer and filling the transparent material in the second hole, wherein the second hole corresponds to the electronic component area.

10. An intelligent terminal, comprising an organic light emitting diode (OLED) display panel, and an electronic component, the OLED display panel comprising:

an electronic component area; and a sub-pixel area correspondingly disposed above the electronic component area;

wherein the sub-pixel area comprises a plurality of sub-pixels, a first hole disposed on one of sub-pixels is filled with a transparent material, and the electronic component is disposed in the electronic component area.

11. The intelligent terminal according to claim 10, wherein the OLED display panel further comprises a thin film transistor layer disposed between the electronic component area and the sub-pixel area, wherein a second hole disposed on the thin film transistor layer and corresponding to the electronic component area is filled with the transparent material.

12. The intelligent terminal according to claim 11, wherein the OLED display panel further comprises a substrate that comprises the electronic component area, wherein the electronic component area is a groove disposed on a side of the substrate away from the sub-pixel area.

13. The intelligent terminal according to claim 12, wherein an orthographic projection of the first hole on the substrate is within the groove.

14. The intelligent terminal according to claim 12, wherein the thin film transistor layer comprises a buffer layer, an active layer, an insulating interlayer, a gate, a gate insulating layer, a source, a drain, and a planarization layer sequentially stacked on the substrate, and wherein the second hole extends through the buffer layer, the active layer, the insulating interlayer, the gate, the gate insulating layer, the source, the drain and the planarization layer, or the second hole extends through the active layer, the insulating interlayer, the gate, the gate insulating layer, the source, the drain, and the planarization layer.

15. The intelligent terminal according to claim 10, wherein the transparent material is selected from siloxane and colorless polyimide.

16. The intelligent terminal according to claim 10, wherein the OLED display panel further comprises a display area disposed outside the electronic component area, wherein pixel density in the sub-pixel area correspondingly disposed above the electronic component area is less than pixel density in the display area.

* * * * *